United States Patent [19]
O'Toole et al.

[11] Patent Number: 5,212,442
[45] Date of Patent: May 18, 1993

[54] FORCED SUBSTRATE TEST MODE FOR PACKAGED INTEGRATED CIRCUITS

[75] Inventors: James E. O'Toole; Brian P. Higgins, both of Boise, Id.

[73] Assignee: Micron Technology, Inc., Boise, Id.

[21] Appl. No.: 854,485

[22] Filed: Mar. 20, 1992

[51] Int. Cl.$^5$ .................. G01R 31/02; G11C 7/00
[52] U.S. Cl. .................. 324/158 R; 324/73.1; 365/201; 371/21.1
[58] Field of Search .............. 324/158 R, 73.1; 371/21.1, 15.1, 21.4, 29.2; 365/189.11, 201; 340/657; 307/303, 303.1

[56] References Cited

U.S. PATENT DOCUMENTS

| | | | |
|---|---|---|---|
| 4,860,261 | 8/1989 | Kreifels et al. | 365/201 |
| 5,023,840 | 6/1991 | Tobita | 365/201 |
| 5,065,091 | 11/1991 | Tobita | 324/73.1 |
| 5,079,763 | 1/1992 | Suwa et al. | 365/201 |
| 5,119,337 | 6/1992 | Shimizu et al. | 365/201 |

Primary Examiner—Vinh Nguyen
Attorney, Agent, or Firm—Michael W. Starkweather

[57] ABSTRACT

An integrated circuit such as an SRAM or DRAM fabricated in a package having a number of external pins includes a plurality of inputs and outputs electrically coupled to the external package pins, an internal substrate that is unconnected to any of the external pins, a test mode indicator circuit having an input coupled to an external pin and an output for providing a test mode signal and a switch responsive to the test mode signal for coupling the substrate to a predetermined voltage. The predetermined voltage can either be ground, or a negative voltage introduced on a pin that is normally set to a logic zero during package level testing. The test mode signal can also be used to disable the on-chip charge pump. The test mode indicator circuit can include a super voltage indicator, an electronic key, or latch circuit in order to receive the test mode indication signal on an existing package pin.

21 Claims, 4 Drawing Sheets

FORCED SUBSTRATE TEST MODE FOR PACKAGED INTEGRATED CIRCUITS

BACKGROUND OF THE INVENTION

This invention relates generally to packaged integrated circuits in which the substrate of the integrated circuit is unconnected to an external package pin and, more particularly, to a method and apparatus for forcing the substrate to a predetermined voltage during package level testing.

Many types of integrated circuits employ on-chip substrate bias generators (also known as "charge pumps") for enhanced performance by lowering the junction capacitance between diffused areas and the substrate, and by reducing the body effect on integrated field-effect transistors ("FETs"). Charge pumps are typically used on complimentary metal-oxide semiconductor ("CMOS") memory circuits such as static random-access memories ("SRAMs") and dynamic random-access memories ("DRAMs"), but are not limited to these applications.

Referring now to FIG. 1, a simplified block diagram of a packaged integrated memory circuit 10 includes a package 12, external package pins 14, and dedicated package pins 16, 18, 20, and 22. External package pins 14 typically provide electrical connection for address busses and control functions for the memory. Pin 16 provides electrical connection to a first power supply voltage VCC, pin 18 provides electrical connection to a second power supply voltage VSS, pin 20 receives an inverted chip select signal, and pin 22 receives an inverted output enable signal. Pins 14–22 are only shown as being representative of a typical memory circuit but other varied configurations are possible. It is important to note that the substrate is not connected to any of the external package pins.

Inside the package, the integrated circuit includes a primary memory circuit 26, a charge pump 24, and a substrate 28. The charge pump 24 and memory circuit 26 are integrated together in a single integrated circuit, which is in physical and electrical contact with the substrate 28. Conductors 30 and 32 are shown only to illustrate the substrate voltage. The charge pump 24 is powered by VCC and VSS and generates the −1 volt VBB voltage for driving the substrate. In turn, the entire substrate is biased to −1 volts, including the portion underlying the memory circuit 26.

Integrated circuit memory circuits are typically tested at wafer sort where, since the integrated circuit has not yet been packaged, the substrate can be readily electrically contacted. During testing, the positive power supply voltage VCC and the substrate voltage VBB are varied in order to stress certain failure mechanisms and identify both failed and marginally performing circuits. Once the integrated circuits are packaged, however, access to the substrate is lost and the ability to stress failure mechanisms related to the substrate voltage is diminished.

Accordingly, a need remains for a mechanism for forcing the internal substrate voltage VBB once the integrated circuit has been packaged to allow more thorough testing.

SUMMARY OF THE INVENTION

It is, therefore, an object of the invention to provide a circuit and test method for testing a packaged integrated circuit wherein the substrate is forced to a predetermined voltage.

Another object of the invention is to improve the reliability of packaged integrated circuits.

A still further object of the invention is to provide a substrate forcing circuit responsive to a test indication signal without increasing the number of external package pins.

According to the present invention, an integrated circuit such as an SRAM or DRAM fabricated in a package having a number of external pins includes a plurality of inputs and outputs electrically coupled to the external package pins, an internal substrate that is unconnected to any of the external pins, a test mode indicator circuit having an input coupled to an external pin and an output for providing a test mode signal and a switch responsive to the test mode signal for coupling the substrate to a predetermined voltage. The predetermined voltage can either be ground, or a negative voltage introduced on a pin that is normally set to a logic zero during package level testing. The test mode signal can also be used to disable the on-chip charge pump. The test mode indicator circuit can include a super voltage indicator, an electronic key circuit, or a latch circuit in order to receive the test mode indication signal on an existing package pin.

During package level testing, an external test mode indicator signal is generated by the tester and applied to an external pin. The test mode indicator circuit generates a corresponding internal test mode signal in response to the external test mode signal. A switch responsive to the internal test mode signal forces the substrate to ground or a desired negative voltage. The tester then proceeds with the package level integrated circuit test steps, which can now include substrate related stress testing. If desired, the on-chip substrate generator can be disabled or left active and simply overridden by the forced substrate voltage.

The foregoing and other objects, features and advantages of the invention will become more readily apparent from the following detailed description of a preferred embodiment of the invention which proceeds with reference to the accompanying drawings.

DETAILED DESCRIPTION

Figure 1:
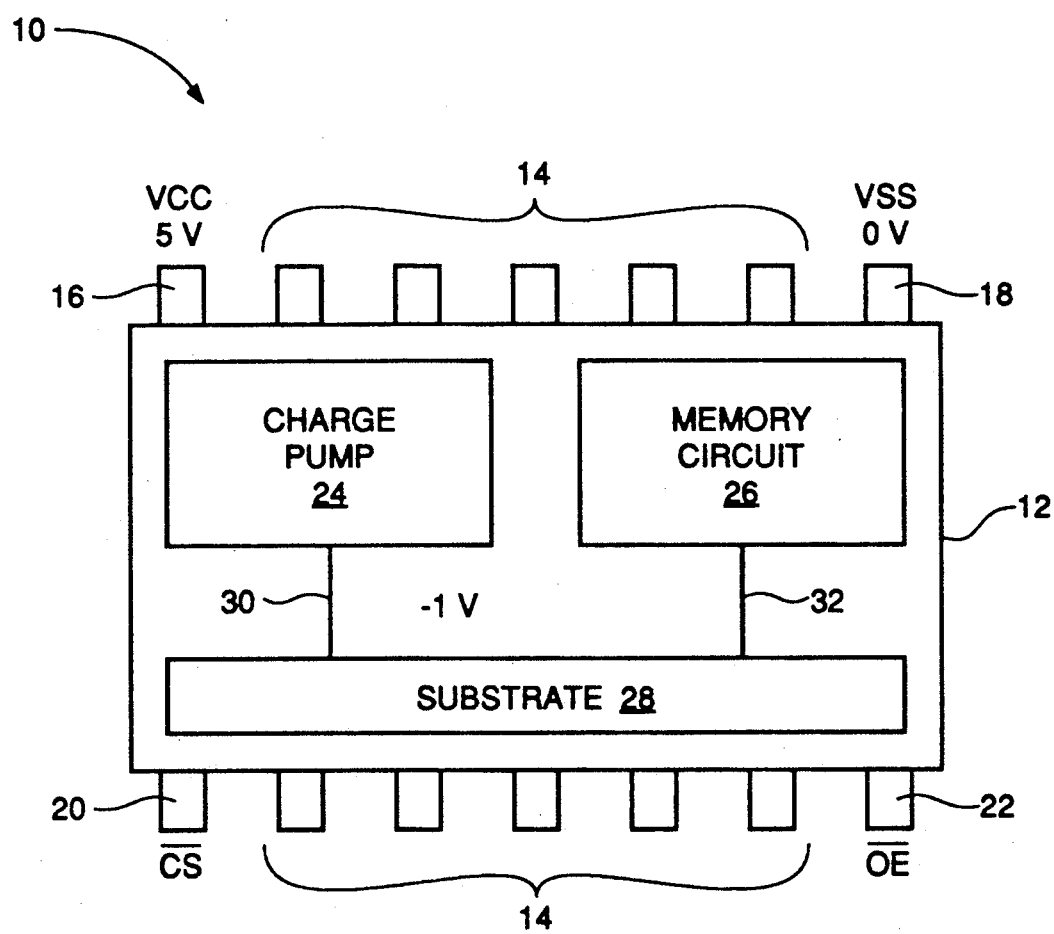
FIG. 1 is a simplified block diagram of a packaged integrated memory circuit.
Figure 2:
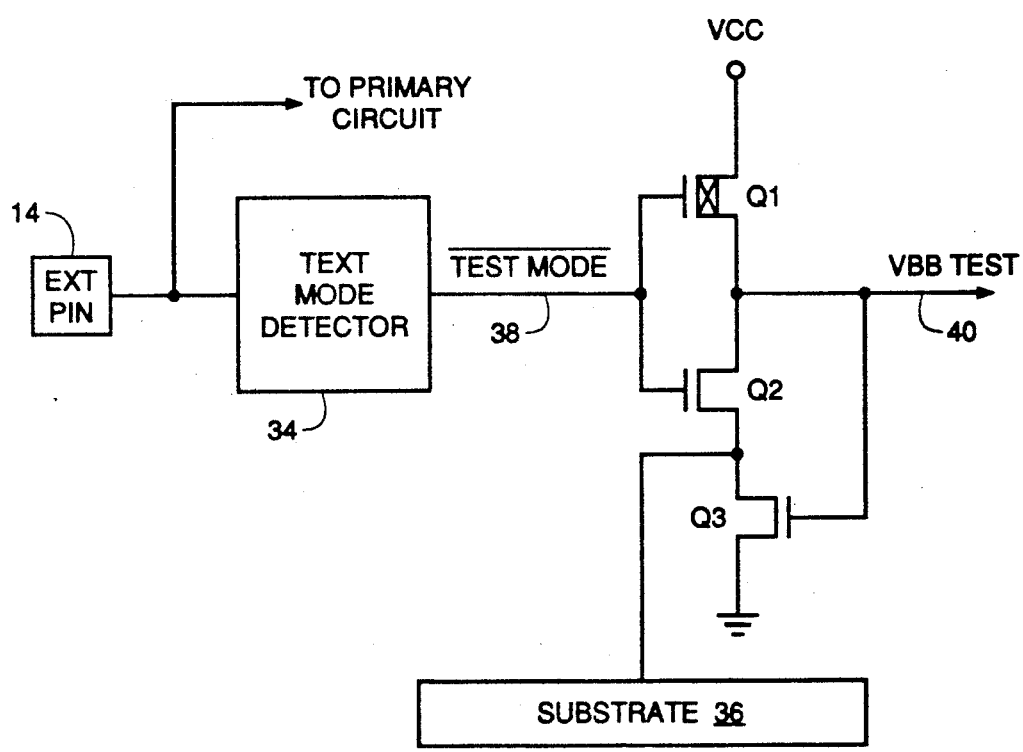
FIGS. 2–4 are alternative embodiments of a substrate forcing circuit according to the present invention.

Referring now to FIG. 2, a first embodiment of the forcing circuit is shown for forcing an integrated circuit substrate to ground. The forcing circuit of FIG. 2 is to be manufactured on a integrated circuit together with a primary circuit such as a DRAM or SRAM. The integrated circuit is fabricated in a package having a number of external pins in electrical contact with the primary circuit and forcing circuit, but none of the external pins are connected with the integrated circuit substrate. The forcing circuit includes a test mode indicator or detector circuit 34 having an input coupled to an external primary circuit pin 14 and an output for providing a test mode signal TESTMODE* on conductor 38. An N-channel switching transistor Q3 has a drain coupled to the substrate 36, a source coupled to ground, and a gate for receiving the test mode signal VBBTEST, which is logically inverted from TEST- MODE*. The TESTMODE* signal is inverted by an inverter stage including a P-channel transistor Q1 and an N-channel transistor Q2. The VBBTEST signal can be used by a charge pump disable means 64 to disable an on-chip charge pump 28 to release control of the substrate voltage. However, this is not necessary if switching transistor Q3 is appropriately sized and is capable of overriding the action of the charge pump.

In the forcing circuit of FIG. 2, the test mode detector 34 can be a supervoltage detector responsive to a boosted voltage logic signal such as ten volts, or an electronic key circuit. A supervoltage detector circuit is shown in greater detail in FIG. 4, although other supervoltage detector circuits are known in the art. An electronic key circuit is known in the art as a type of digital or analog circuit that responds to a combination of inputs not normally allowed during normal operation of the integrated circuit. For example, in a DRAM, applying a CAS* (column address strobe) input signal before a RAS* (row address Strobe) input signal while holding the WE* (write enable) signal low is a sequence that is not encountered or allowed during normal operation. An electronic key circuit can be designed by those skilled in the art to provide a TESTMODE* signal in response to this sequence of input signals. Other types of test mode detector circuits can be designed that recognize an externally applied signal or signals requesting the forced-substrate test mode.

If desired, a toggle-type flip-flop latch circuit 62 can be placed in series with the output of the test mode detector circuit 34. The latch 62 can be used to store the TESTMODE* signal from the detector 34, such that the supervoltage input signal may be removed without disabling the test mode condition. The input pin 14 to the detector can then be used normally in conjunction with the forced-substrate package level testing. The test mode condition can be terminated by simply reapplying the supervoltage, which toggles the flip-flop, changes the polarity of the TESTMODE* signal, and takes the integrated circuit out of the test mode.

In operation, the package-level test apparatus used generates an external test mode signal that is applied to one of the external pins, such as a supervoltage logic signal. The external pin is used to transfer signals to the primary memory circuit during normal operation, but in the forced-substrate test mode, it is used to transfer the external test mode signal to the test mode detector 34. In response to the external test mode signal, the detector circuit 34 generates an internal test mode signal such as TESTMODE* or VBBTEST to close an integrated switch. In turn, the switch forces the substrate to ground in response to the internal test mode signal. Package level test steps are subsequently performed to determine the affect of substrate potential on the primary circuit performance. During the test, the integrated circuit charge pump can be disabled, if desired.

Figure 3:
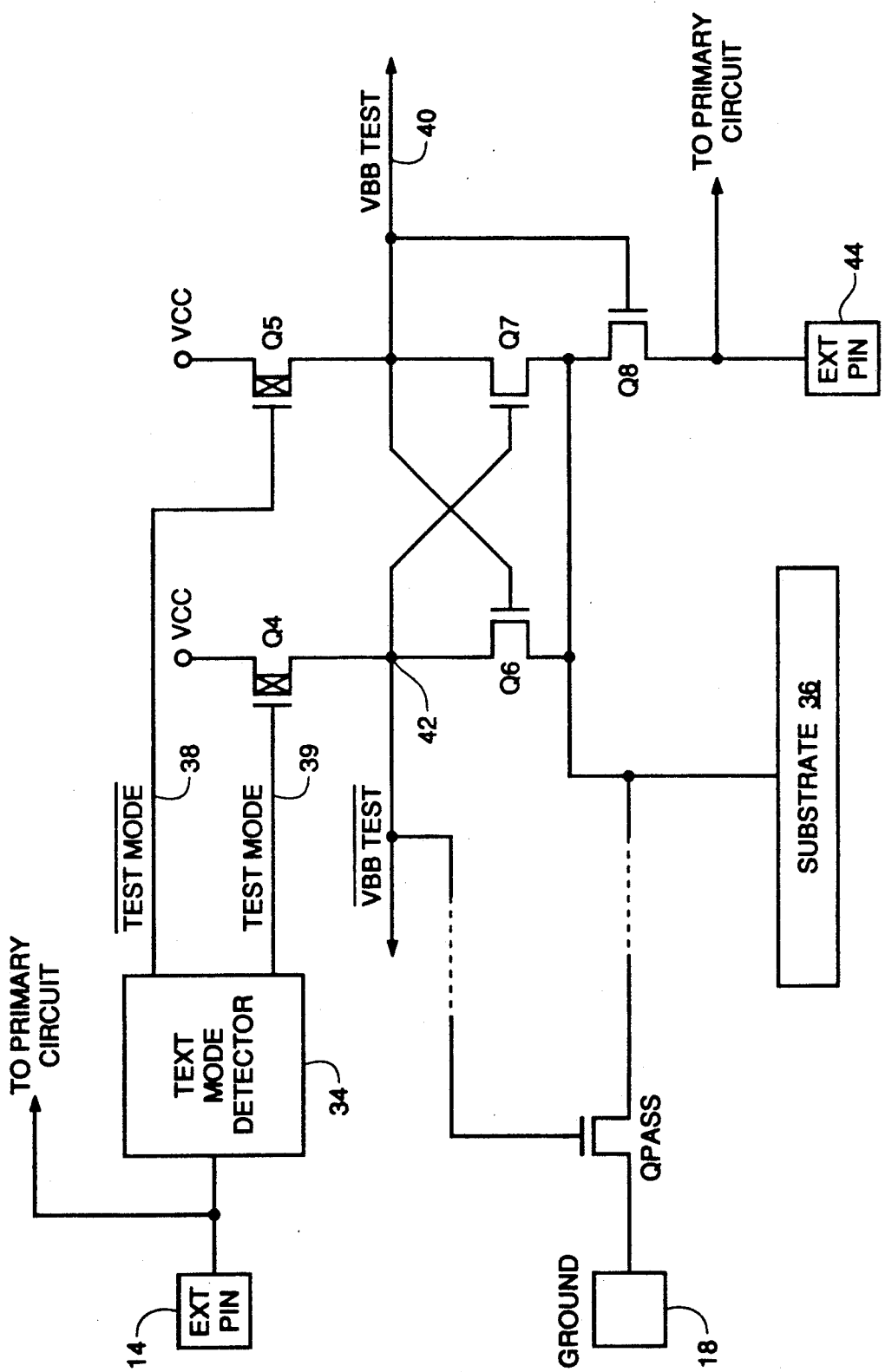

An alternative embodiment of the forcing circuit that allows connection of any negative voltage to the substrate is shown in FIG. 3. As in the previous embodiment, the forcing circuit includes a test mode detector 34 and a switching transistor Q8, for connecting the substrate 36 to a predetermined voltage through an external pin 44. However, in the forcing circuit shown in FIG. 3, the substrate voltage can be connected to any arbitrary negative voltage. The forcing circuit includes a test mode detector circuit 34 having an input coupled to an external primary circuit pin and an output for providing complementary test mode signals TEST-MODE and TESTMODE* on conductors 38 and 39. An N-channel switching transistor Q8 has a drain coupled to the substrate 36, a source coupled to the external pin 44, and a gate for receiving the test mode signal VBBTEST, which is logically inverted from TESTMODE*. Additional circuitry includes P-channel transistors Q4 and Q5, as well as N-channel transistors Q6 and Q7 to form a positive feedback amplifier for controlling the switching action of transistor Q8, as well as the generation of the VBBTEST signal for disabling the on-chip charge pump, if desired. The gates of transistors Q4 and Q5 respectively receive the TESTMODE and TESTMODE* signals, the sources being coupled to the five volt VCC power supply. The drains and cross coupled gates of transistors Q6 and Q7 are respectively coupled to the drains of transistors Q4 and Q5. The coupled drains of transistors Q5 and Q7 are coupled to the gate of transistor Q8 and form the VBBTEST signal on conductor 40. The sources of transistors Q6 and Q7 are coupled to the substrate 36.

In operation, the forcing circuit of FIG. 3 allows connection of any negative voltage to the substrate 36 through external pin 44. The external pin 44 selected is ideally one that allows the primary memory circuit to function when forced to a logic low condition. In an SRAM, for example, the chip select CS* or output enable OE* pins can be used. During normal operation TESTMODE* is at a logic high state and TESTMODE is at a logic low state. Transistor Q4 is on and circuit node 42 is at a logic high state. Transistor Q7 is also on and effectively connects the gate of switching transistor Q8 to the substrate 36. During normal operation, the voltage on the substrate 36 is about −1volts and therefore switching transistor Q8 is off. The external pin 44 is therefore electrically isolated from the substrate 36. During the substrate-forcing test mode, TESTMODE is at a logic high state and TESTMODE* is at a logic low state. Transistor Q5 turns on, which brings VBBTEST high and turns on transistor Q8. Transistor Q6 is also turned on, which brings node 42 to the substrate potential. Thus, transistor Q7 is turned off, and the substrate 36 and the external pin 44 are electrically coupled together.

The forcing circuit of FIG. 3 can also be used to couple the internal substrate 36 to an alternative negative potential in an integrated circuit with a grounded substrate. To accomplish this, it is desirable that the connection between the substrate 36 and ground be made through a pass transistor QPASS, whose gate receives the VBBTEST* signal at node 42, drain is coupled to the substrate 36, and source is coupled to ground. Note that pass transistor QPASS can be turned off with the VBBTEST* signal, since the gate and source are forced to the same negative voltage. In turn, the substrate 36 is decoupled from ground and forced to the alternative negative potential placed on external pin 44.

Figure 4:
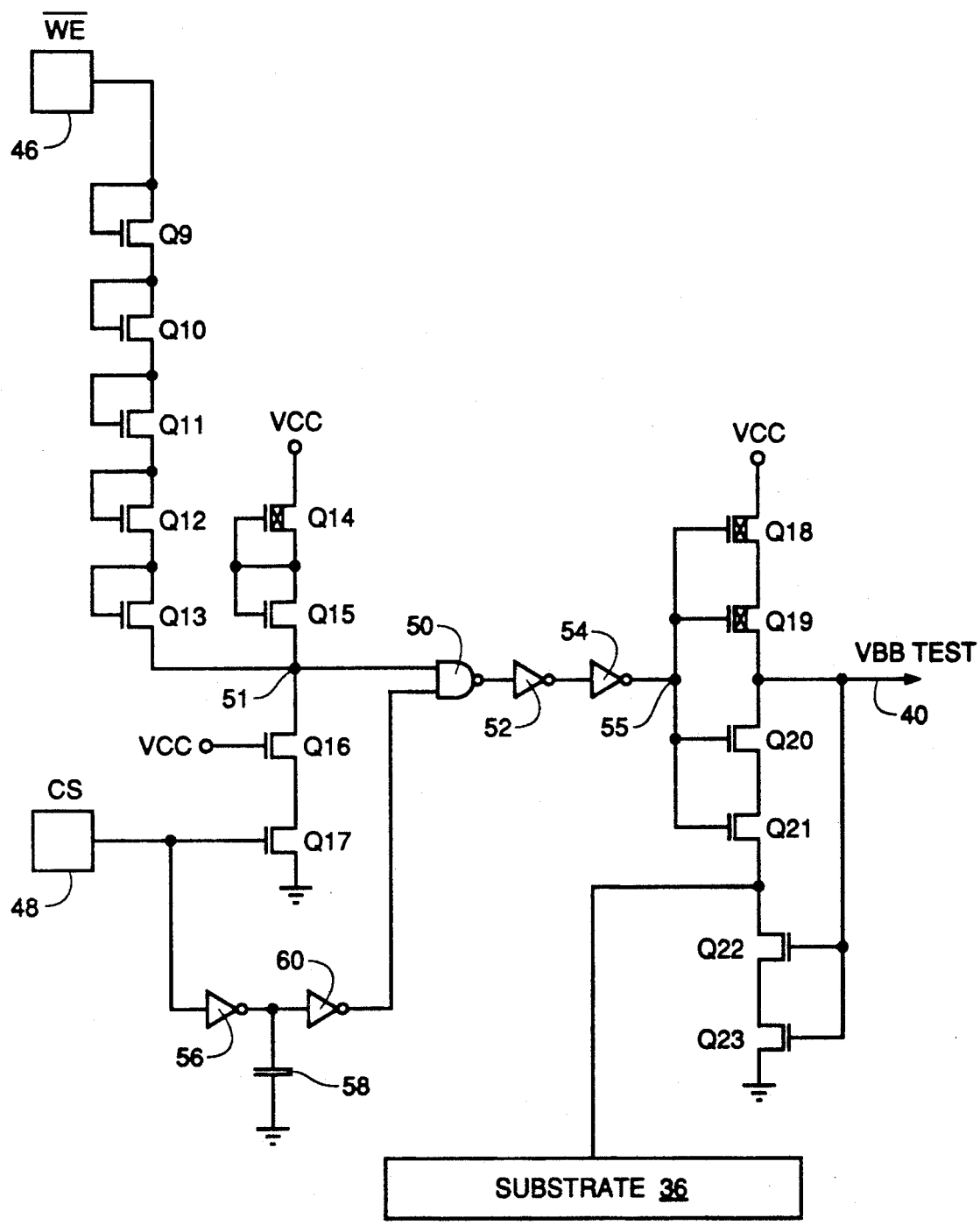

A more detailed schematic of a forcing circuit having a super voltage test mode indicator circuit and an FET switch is shown in FIG. 4. This circuit is suitable for integration with a one megabit SRAM integrated memory circuit, and forces the internal substrate voltage to ground during the test mode. The super voltage test mode indicator includes a level shifter having an input coupled to an external pin, such as the write enable WE* pin, and an output for providing a logic signal that is shifted approximately five volts down from the logic signal at the WE* pin. The level shifter includes diode-connected N-channel transistors Q9-Q13, which are coupled in series. The coupled drain and gate of transistor Q9 forms the input of the level shifter and the source of transistor Q13 forms the output of the level shifter.

Additional logic circuitry 70 has a first input coupled to the output of the level shifter at circuit node 51, a second input for receiving a chip select CS signal at external pin 48, and an output for providing an inverted test mode signal at circuit node 55. The input section of the logic circuit includes a load 68 coupled between the VCC supply voltage and the input 51, an N-channel transistor Q17 having a drain coupled to the logic circuit input 51 through transistor Q16, a gate for receiving the chip select CS signal, and a source coupled to ground. The load 68 includes a diode-connected P-channel transistor Q14 and a diode-connected N-channel transistor Q15 coupled in series to provide a voltage on node 51 approximately two volts below the power supply voltage VCC. A delay generator including inverters 56 and 60, as well as capacitor 58 has an input for receiving the chip select CS signal and an output at the output of inverter 60. A NAND logic gate 50 has a first input coupled to the logic circuit 70 input 51, a second input coupled to the output of the delay generator, and an output for providing the test mode signal. The NAND gate 50 has a logic switching threshold greater than 3 volts, as will be explained below. The output of the NAND gate 50 is further processed by serially-connected inverters 52 and 54 to form a clean logic signal of the same polarity at the input of latch 62. The latch 62 maintains the logic signal at logic circuit node 55.

The FET switch in the circuit of FIG. 4 includes an inverter 72 having an input for receiving the test mode signal at circuit node 55 and an output for providing the VBBTEST signal on conductor 40. The VBBTEST signal is coupled to a charge pump disable means 64 for disabling the on-chip charge pump 28. The inverter 72 includes serially-connected P-channel transistors Q18 and Q19, and serially-connected N-channel transistors Q20 and Q21. The inverter 72 is of conventional design, with two transistors of each polarity type being used to reduce conductivity and increase breakdown voltage. In the alternative, the length of transistors Q18 and Q21 can be increased, and transistors Q19, Q20, and Q22 can be eliminated. N-channel transistors Q22 and Q23 comprise a serially connected N-channel FET 74 that operates in conjunction with the inverter 72 to couple the substrate 36 to ground. The N-channel switching transistor Q23 has its gate coupled to the output of the inverter at conductor 40, a drain coupled to the source of transistor Q22, and a source coupled to ground. Transistor Q22 has its gate coupled to the output of the inverter at conductor 40, a drain coupled to the substrate 36 and the source of transistor Q21, and a source coupled to the drain of transistor Q23.

In operation, the forcing circuit of FIG. 4 receives both a write enable WE* signal and a chip select CS signal on the corresponding dedicated external pins. For the forcing circuit to be active, both the WE* and CS signals must be at a logic high state. A supervoltage ten volt WE* signal is voltage shifted down to approximately five volts at circuit node 51, which also turns off the load transistors Q14 and Q15. A logic high at the chip select pin 48 is transferred through the delay generator to eventually pass a logic one to the NAND gate 50. Since both of the inputs to NAND gate 50 are at a logic high state, the output is at a logic low state. The risetime of the wavefront is improved by the action of inverters 52 and 54, although the polarity from the output of NAND gate 50 to circuit node 55 is not changed. A logic low state at node 55 turns on P-channel transistors Q18 and Q19 to a logic high state, pulling VBBTEST at node 40 high. Simultaneously, the logic low state at node 55 turns off N-channel transistors Q20 and Q21. Since VBBTEST is a logic high signal, transistors Q22 and Q23 are both on. However, no current flows through transistor Q22 since transistors Q20 and Q21 are both off. Switching transistors Q22 and Q23 are on and provide the electrical connection from the substrate 36 to ground.

If the write enable WE* signal is not a supervoltage of about ten volts, as in a normal reading or writing mode, circuit node 51 falls to a level of about three volts due to the action of load transistors Q14 and Q15 in conjunction with transistors Q16 and Q17. The switching threshold of NAND gate 50 has been adjusted from the normal CMOS level of about 2.5 volts to a nominal four volt switching threshold. Thus, the three volt level at circuit node 51 is interpreted by NAND gate 50 as a logic low level, producing a logic high state at the output thereof. The logic high state switches the state of the inverter, turning off transistors Q18 and Q19, and turning on transistors Q20 and Q21. VBBTEST is pulled low to the substrate voltage, turning off transistors Q22 and Q23. The substrate 36 is thus electrically isolated from both ground and the rest of the logic circuit.

A logic low signal at the CS chip select pin 48 similarly turns off transistors Q22 and Q23, electrically isolating the substrate 36. The gate of transistor Q17 is coupled to the CS pin 48 so that in the standby mode (CS at a logic low) no current flows through transistors Q14-Q17. Low standby current is highly desirable and required in many applications. The delay circuit including inverters 56 and 60, as well as capacitor 58, is thus necessary to prevent the memory circuit from entering the substrate-forcing test mode during normal operation when chip select is toggled between a deselected and selected state. It is possible that node 51 can be coupled to a high potential, above the threshold of NAND gate 50, while CS is in a logic low state. When CS is switched to a logic high state, enough time must be allowed for transistors Q16 and Q17 to discharge node 51 to its normal level of approximately two volts below the VCC supply voltage. Inverters 56 and 60, in conjunction with capacitor 58, keep the output of inverter 60 in a logic low state, which keeps the output of NAND gate 50 at a logic high state for a sufficiently long time for node 51 to return to its proper level. The delay is set by the size of the pulldown transistor in inverter 56 in conjunction with the size of capacitor 58.

Having described and illustrated the principles of the invention in a preferred embodiment thereof, it is apparent to those skilled in the art that the invention can be modified in arrangement and detail without departing from such principles. For example, the exact circuit configuration, nature of the primary circuit used, identity of the dedicated or non-dedicated pins used, and the exact forced substrate voltage can all be changed as desired in any specific application. We therefore claim all modifications and variations coming within the spirit and scope of the following claims.

We claim:

1. An integrated circuit fabricated in a package having a number of external pins, the integrated circuit comprising:
   a primary circuit having a plurality of inputs and outputs electrically coupled to the external pins;
   an integrated circuit substrate that is unconnected to any of the external pins;
   a test mode indicator having an input coupled to an external pin and an output for providing a test mode signal;
   a charge pump for biasing the substrate to a predetermined voltage in a normal operating mode; and
   a switch for controlling the substrate voltage in a test mode independently of the operation of the charge pump, the switch having a first node coupled to the substrate, a second node coupled to a voltage source, and an input for receiving the test mode signal.

2. An integrated circuit as in claim 1 further comprising means for disabling the charge pump in response to the test mode signal.

3. An integrated circuit as in claim 1 in which the test mode indicator comprises a super voltage indicator.

4. An integrated circuit as in claim 1 in which the test mode indicator comprises an electronic key circuit.

5. An integrated circuit as in claim 1 further comprising a latch interposed between the test mode indicator and the switch.

6. An integrated circuit as in claim 1 in which the primary circuit comprises a static random access memory.

7. An integrated circuit as in claim 1 in which the primary circuit comprises a dynamic random access memory.

8. An integrated circuit as in claim 1 in which the substrate voltage is substantially equal to the source voltage.

9. An integrated circuit as in claim 1 in which the switch is coupled to the voltage source at the second node through an external pin.

10. An integrated circuit fabricated in a package having a number of external pins, the integrated circuit comprising:
    a primary circuit having a plurality of inputs and outputs electrically coupled to the external pins;
    an integrated circuit substrate that is unconnected to any of the external pins;
    a super voltage test mode indicator having an input coupled to an external pin and an output for providing a test mode signal;
    a charge pump for biasing the substrate to a predetermined voltage in a normal operating mode; and
    an FET switch for controlling the substrate voltage in a test mode independently of the operation of the charge pump, the switch having a first node coupled to the substrate, a second node coupled to a voltage source, and an input for receiving the test mode signal.

11. An integrated circuit as in claim 10 in which the super voltage test mode indicator comprises:
    a level shifter having an input coupled to an external pin and an output; and
    logic means having a first input coupled to the output of the level shifter, a second input for receiving a chip select signal, and an output for providing the test mode signal.

12. An integrated circuit as in claim 10 in which the logic means comprises:
    a load coupled between a source of supply voltage and the input of the logic means;
    an N-channel FET having a drain coupled to the input of the logic means, a gate for receiving the chip select signal, and a source coupled to ground;
    a delay generator having an input for receiving the chip select signal and an output; and
    a logic gate having a first input coupled to the input of the logic means, a second input coupled to the output of the delay generator, and an output for providing the test mode signal.

13. An integrated circuit as in claim 12 in which the load comprises a diode-connected P-channel FET and a diode-connected N-channel FET coupled in series.

14. An integrated circuit as in claim 12 in which the logic gate comprises a NAND gate having a switching threshold greater than 2.5 volts.

15. An integrated circuit as in claim 10 in which the FET switch comprises:
    an inverter having an input for receiving the test mode signal and an output; and
    an N-channel FET having a gate coupled to the output of the inverter, a drain forming the first node of the switch, and a source forming the second node of the switch.

16. An integrated circuit as in claim 10 further comprising means for disabling the charge pump in response to the test mode signal.

17. An integrated circuit as in claim 10 further comprising a latch interposed between the super voltage test mode indicator and the FET switch.

18. An integrated circuit as in claim 10 in which the primary circuit comprises a static random access memory.

19. An integrated circuit as in claim 10 in which the primary circuit comprises a dynamic random access memory.

20. An integrated circuit as in claim 10 in which the substrate voltage is substantially equal to the source voltage.

21. An integrated circuit as in claim 10 in which the switch is coupled to the source at the second node through an external pin.

* * * * *